US011094393B1

(12) United States Patent
Alavoine

(10) Patent No.: US 11,094,393 B1
(45) Date of Patent: Aug. 17, 2021

(54) APPARATUS AND METHOD FOR CLEARING MEMORY CONTENT

(71) Applicant: QUALCOMM Incorporated, San Diego, CA (US)

(72) Inventor: Olivier Alavoine, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/010,037

(22) Filed: Sep. 2, 2020

(51) Int. Cl.
| | |
|---|---|
| *G11C 29/42* | (2006.01) |
| *G11C 29/44* | (2006.01) |
| *G11C 7/06* | (2006.01) |
| *G06F 11/14* | (2006.01) |
| *G11C 7/20* | (2006.01) |
| *G11C 7/10* | (2006.01) |
| *G11C 7/12* | (2006.01) |

(52) U.S. Cl.
CPC .......... *G11C 29/42* (2013.01); *G06F 11/1417* (2013.01); *G11C 7/06* (2013.01); *G11C 7/1045* (2013.01); *G11C 7/12* (2013.01); *G11C 7/20* (2013.01); *G11C 29/44* (2013.01)

(58) Field of Classification Search
CPC .......... G11C 11/06; G11C 29/42; G11C 7/06; G11C 7/12; G11C 29/44
See application file for complete search history.

(56) References Cited

U.S. PATENT DOCUMENTS

| | | | | |
|---|---|---|---|---|
| 5,402,380 A | * | 3/1995 | Kumakura | ............... G11C 5/14 365/185.08 |
| 2011/0288807 A1 | * | 11/2011 | Iwase | .................. G06F 11/0751 702/117 |
| 2020/0176061 A1 | * | 6/2020 | Maejima | ............... G11C 16/14 |

* cited by examiner

*Primary Examiner* — Han Yang
(74) *Attorney, Agent, or Firm* — Patterson & Sheridan, L.L.P

(57) ABSTRACT

Aspects of the present disclosure relate to systems and methods for issuing and executing a clear content command within a memory. Certain embodiments provide a method for the memory to receive a clear content command configured to clear content stored on the memory in a first set of memory cells of the plurality of memory cells of the plurality of memory banks. Certain embodiments provide a method of implementing within a DRAM memory the clear command by reusing existing refresh mechanism with minimal or no additional transistors or other hardware within the sense amplifier circuitry of the memory.

30 Claims, 10 Drawing Sheets

|  |  | Single Data Rate (SDR) Pins |  |  |  |  |  | Clock Edge |
|---|---|---|---|---|---|---|---|---|
|  |  | CA0 | CA1 | CA2 | CA3 | CA4 | CA5 |  |
| Clear Data Command 502 | First Phase 504 | L | H | L | H | L | H | R1 |
|  | Second Phase 506 | H | L | H | L | H | L | R2 |

FIG. 5A

|  |  | Double Data Rate (DDR) Pins |  |  |  |  |  | Clock Edge |
|---|---|---|---|---|---|---|---|---|
|  |  | CA0 | CA1 | CA2 | CA3 | CA4 | CA5 |  |
| Clear Data Command 522 | First Phase 524 | L | L | L | H | H | H | R1 |
|  | Second Phase 526 | H | H | H | L | L | L | F2 |

FIG. 5B

APPARATUS AND METHOD FOR CLEARING MEMORY CONTENT

BACKGROUND

Field of the Disclosure

Aspects of the present disclosure relate to memory devices, and in particular to systems and methods for issuing and executing a command to clear memory content.

Description of Related Art

Generally, a main memory in a computing system may use random access memory (RAM) devices as a volatile memory source. RAMs are particularly useful as memories because of their density and speed. One of the disadvantages is that a RAM may occasionally experience errors due to, for example, a neutron or alpha particle crossing the die, faulty components, inaccurate system timing, etc. This disadvantage may be particularly problematic for computing systems that communicate critical data or data that is required to be virtually error-free.

For this reason, computer systems may include error correction circuitry which generates and stores one or more error correction code (ECC) bits associated to data being stored in the RAM. Here, when stored data is read from main memory, the associated ECC bits are also read out and transmitted to an error correction circuitry for appropriate evaluation and, if necessary, error correction. In some RAM devices, ECC bits are stored "in-line" with the corresponding data. In one example, for every 512 bits payload data stored in the RAM device, there is an associated ECC bit stored in same DRAM in another location (address) than payload data.

However, to perform certain memory functions (e.g., partial data writes), the RAM regions storing the data and its corresponding ECC bits must be initialized to matching values. For example, an application or processor may need to perform a process to initialize the RAM regions that store both the data and the ECC bits by writing zeros into the regions. However, such a process may require a relatively large amount of time and power. In one example, this could pose problems for RAM devices that are battery powered. As RAM devices are utilized more, there exists a need for further improvements to such devices.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description" one will understand how the features of this disclosure provide advantages.

Certain embodiments provide a method of clearing content stored on a memory of an electronic device, the memory comprising a plurality of memory banks on each of which a plurality of memory cells are arranged, each of the plurality of memory cells coupled to an associated sense amplifier. In some examples, the method includes receiving a clear content command configured to clear content stored on the memory in a first set of memory cells of the plurality of memory cells of the plurality of memory banks. In some examples, the method includes, in response to the clear content command, activating a first switch and a second switch of each sense amplifier associated with each of the first set of memory cells, the first switch coupled between a first bit line of a corresponding memory cell and a ground, the second switch coupled between a second bit line of the corresponding memory cell and the ground, wherein activating the first switch and the second switch is configured to clear the corresponding memory cell by grounding the first bit line and the second bit line.

In some examples, the clear content command comprises a first phase command and a second phase command, the first phase command comprising a first sequence of bits, and the second phase command having a second sequence of bits complementary to the first sequence of bits.

In some examples, receiving the clear content command comprises receiving the first phase command prior to receiving the second phase command.

In some examples, receiving the clear content command comprises reading a multi-bit command stored in a mode register.

In some examples, the method further comprises clearing the mode register in response to a determination that the content of the first set of memory cells has been cleared.

In some examples, the memory is a dynamic random-access memory (DRAM) utilizing in-line error correction code (ECC).

In some examples, the controller receives the command in response to an event comprising one or more of: a boot-up of the electronic device; a state error detected in the memory; or a transient error detected in the memory.

In some examples, the clear content command includes an indicator configured to identify the first set of memory cells.

In some examples, the first set of memory cells comprise at least one row of memory cells in each memory bank of the plurality of memory banks.

Certain aspects describe a device. In some examples, the device includes a memory comprising a plurality of memory banks on each of which a plurality of memory cells are arranged, each of the plurality of memory cells coupled to an associated sense amplifier. In some examples, the device includes a processor communicatively coupled to the memory. In some examples, the processor is configured to receive a clear content command configured to clear content stored on a first set of memory cells of the plurality of memory cells of the plurality of memory banks. In some examples, the processor is configured to, in response to the clear content command, activate a first switch and a second switch of each sense amplifier associated with each of the first set of memory cells, the first switch coupled between a first bit line of a corresponding memory cell and a ground, the second switch coupled between a second bit line of the corresponding memory cell and the ground, wherein activating the first switch and the second switch is configured to clear the corresponding memory cell by grounding the first bit line and the second bit line.

Certain aspects are directed to an apparatus configured to clear content stored on a memory of an electronic device, the memory comprising a plurality of memory banks on each of which a plurality of memory cells are arranged, each of the plurality of memory cells coupled to an associated sense amplifier. In some examples, the apparatus includes means for receiving a clear content command configured to clear content stored on a first set of memory cells of the plurality of memory cells of the plurality of memory banks. In some examples, the apparatus includes, in response to the clear content command, means for activating a first switch and a second switch of each sense amplifier associated with each of the first set of memory cells, the first switch coupled between a first bit line of a corresponding memory cell and a ground, the second switch coupled between a second bit line of the corresponding memory cell and the ground, wherein activating the first switch and the second switch is configured to clear the corresponding memory cell by grounding the first bit line and the second bit line.

Certain aspect are directed to a non-transitory computer-readable storage medium that stores instructions that when executed by a processor of an apparatus cause the apparatus to perform a method of clearing content stored on a memory of an electronic device, the memory comprising a plurality of memory banks on each of which a plurality of memory cells are arranged, each of the plurality of memory cells coupled to an associated sense amplifier. In some examples, the method includes receiving, by the apparatus, a clear content command configured to clear content stored on a first set of memory cells of the plurality of memory cells of the plurality of memory banks. In some examples, the method includes, in response to the clear content command, activating, by the apparatus, a first switch and a second switch of each sense amplifier associated with each of the first set of memory cells, the first switch coupled between a first bit line of a corresponding memory cell and a ground, the second switch coupled between a second bit line of the corresponding memory cell and the ground, wherein activating the first switch and the second switch is configured to clear the corresponding memory cell by grounding the first bit line and the second bit line.

The following description and the related drawings set forth in detail certain illustrative features of one or more embodiments.

BRIEF DESCRIPTION OF THE DRAWINGS

The appended figures depict certain aspects of the one or more embodiments and are therefore not to be considered limiting of the scope of this disclosure.

FIG. 5A is a first block diagram illustrating example CA encoding of a clear content command suitable for implementing various aspects of the present disclosure.

FIG. 5B is a second block diagram illustrating example CA encoding of a clear content command suitable for implementing various aspects of the present disclosure.

To facilitate understanding, identical reference numerals have been used, where possible, to designate identical elements that are common to the drawings. It is contemplated that elements and features of one embodiment may be beneficially incorporated in other embodiments without further recitation.

DETAILED DESCRIPTION

Aspects of the present disclosure provide methods and apparatuses for issuing and executing a clear content command for clearing content stored in a memory device.

The following description provides examples, and is not limiting of the scope, applicability, or embodiments set forth in the claims. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method that is practiced using other structure, functionality, or structure and functionality in addition to, or other than, the various aspects of the disclosure set forth herein. It should be understood that any aspect of the disclosure disclosed herein may be embodied by one or more elements of a claim.

Although certain teachings of this disclosure are illustrated in terms of a dynamic random access memory (DRAM) device as an example memory device, the teachings are applicable in other areas, such as to other volatile memory devices (e.g., static RAM (SRAM), synchronous SRAM (SDRAM), graphic DRAM (GDRAM), etc.). Further, although certain teachings of this disclosure are illustrated in terms of a system-on-chip (SoC), the teachings are applicable to any suitable computing device utilizing a memory. Thus, the teachings disclosed should not be construed to be limited to DRAM devices or SoCs or the illustrated embodiments. The illustrated embodiments are merely vehicles to describe and illustrate examples of the inventive teachings disclosed herein.

Figure 1:
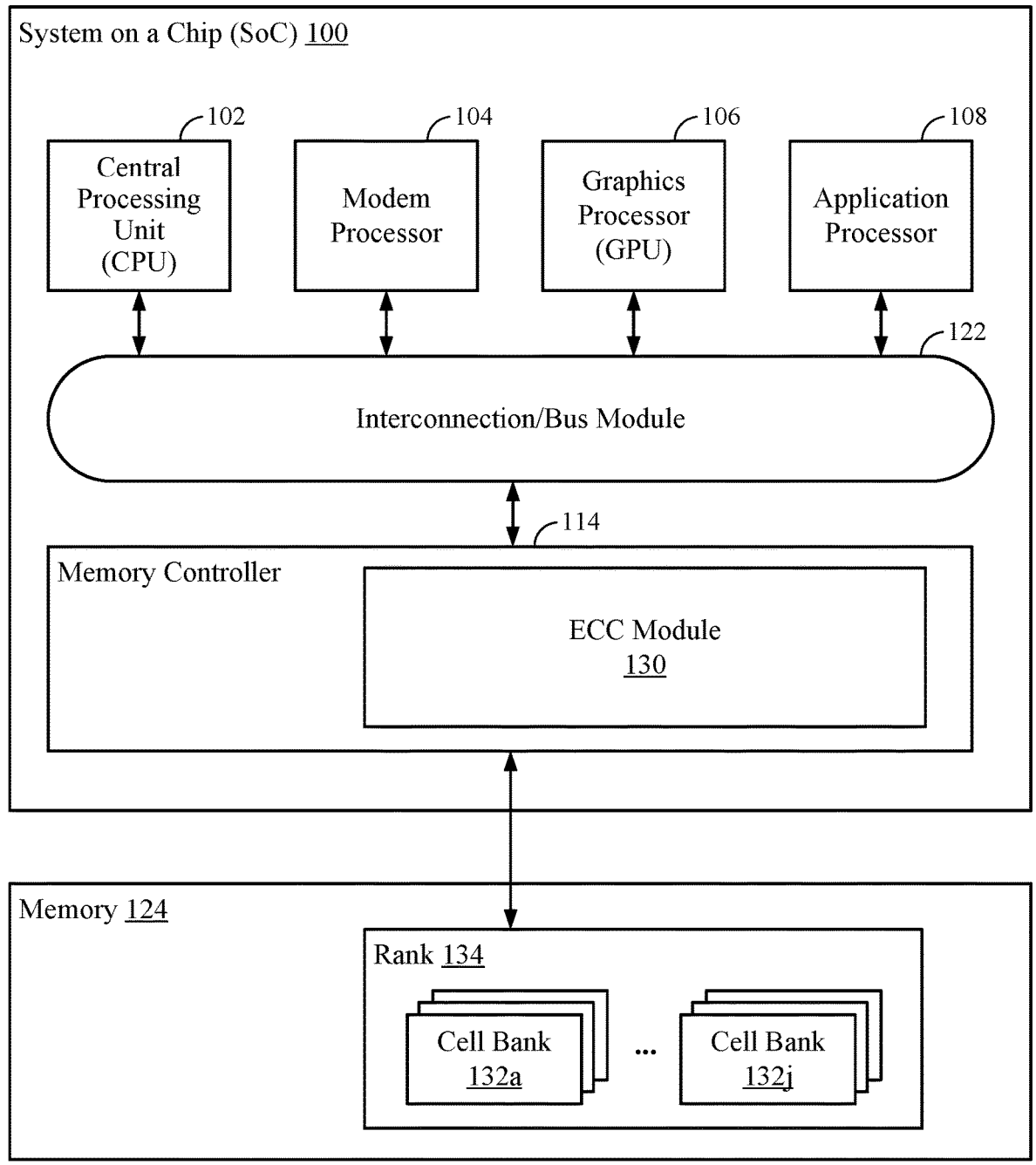
FIG. 1 illustrates example components and interconnections in a system-on-chip (SoC) coupled to a memory suitable for implementing various aspects of the present disclosure.

FIG. 1 illustrates example components and interconnections in a system-on-chip (SoC) 100 coupled to a volatile memory 124 (e.g., DRAM) suitable for implementing various aspects of the present disclosure. The SoC 100 may include a number of heterogeneous processors, such as a central processing unit (CPU) 102, a modem processor 104, a graphics processor 106, and an application processor 108. Each processor 102, 104, 106, 108, may include one or more cores, and each processor/core may perform operations independent of the other processors/cores. The processors 102, 104, 106, 108 may be organized in close proximity to one another (e.g., on a single substrate, die, integrated chip, etc.) so that they may operate at a much higher frequency/ clock-rate than would be possible if the signals were to travel off-chip. The proximity of the cores may also allow for the sharing of on-chip memory and resources (e.g., voltage rail), as well as for more coordinated cooperation between cores.

The processors 102, 104, 106, 108 may be interconnected to a memory controller 114 and other system components (not shown) via an interconnection/bus module 122, which may include an array of reconfigurable logic gates and/or implement a bus architecture (e.g., CoreConnect, advanced microcontroller bus architecture (AMBA), etc.). Communications may also be provided by advanced interconnects, such as high-performance networks on a chip (NoCs).

The memory controller 114 may include a specialized hardware module configured to receive various memory transactions from one or more masters, and address and communicate the memory transactions to the memory 124. The multiple masters may include one or more of the processors 102, 104, 106, 108, and/or applications operating on the processors 102, 104, 106, 108. The memory controller 114 may also manage maintenance of the memory 124, such as scheduling and/or initiating refresh cycles, and as described herein, clear content (e.g., data and/or code) commands. In some examples, the memory controller 114 may include one or more processors configured to perform the operations disclosed herein. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. The memory 124 and memory controller 114 may be an on-chip component (e.g., on the substrate, die, integrated chip, etc.) of the SoC 100; however, it should be noted that in some examples, one or more of the memory 124 and memory controller 114 may be located off-chip.

The memory 124 is a computer-readable storage medium having an interface to the processors 102, 104, 106, 108 via the bus module 122. As discussed, memory 124 may be an on-chip component, or alternatively (as shown) an off-chip component. The memory 124 may provide volatile storage, such as DRAM, for the processors 102, 104, 106, 108 and/or other functional aspects of the SoC 100. As shown the memory controller 114 includes an ECC module 130. The ECC module 130 is configured to implement an ECC logic for detecting and correcting errors in the memory 124 as discussed and known in the art. In certain aspects, the ECC module 130 is configured for performing in-line ECC logic.

The memory 124 may also include a hierarchy of one or more ranks 134 and a plurality of banks 132a-132j (collectively referred to as banks 132) in each rank 134. For example, the memory 124 may include a plurality of ranks, wherein each rank contains a plurality of internal bank structures. In some examples, each bank structure may include a plurality of memory pages, or "rows." Generally, one row of memory can be accessed on each bank at a given time. Each of the banks 132 of a given rank 134 may share a bus (not shown) for reading/writing data. Memory controller 114 can support simultaneous operation of different ranks 134 and banks 132, which can be accessed independently. Because each bank 132 acts as an independent entity, the banks 132 can serve multiple memory requests in parallel, offering bank-level parallelism.

Figure 2:
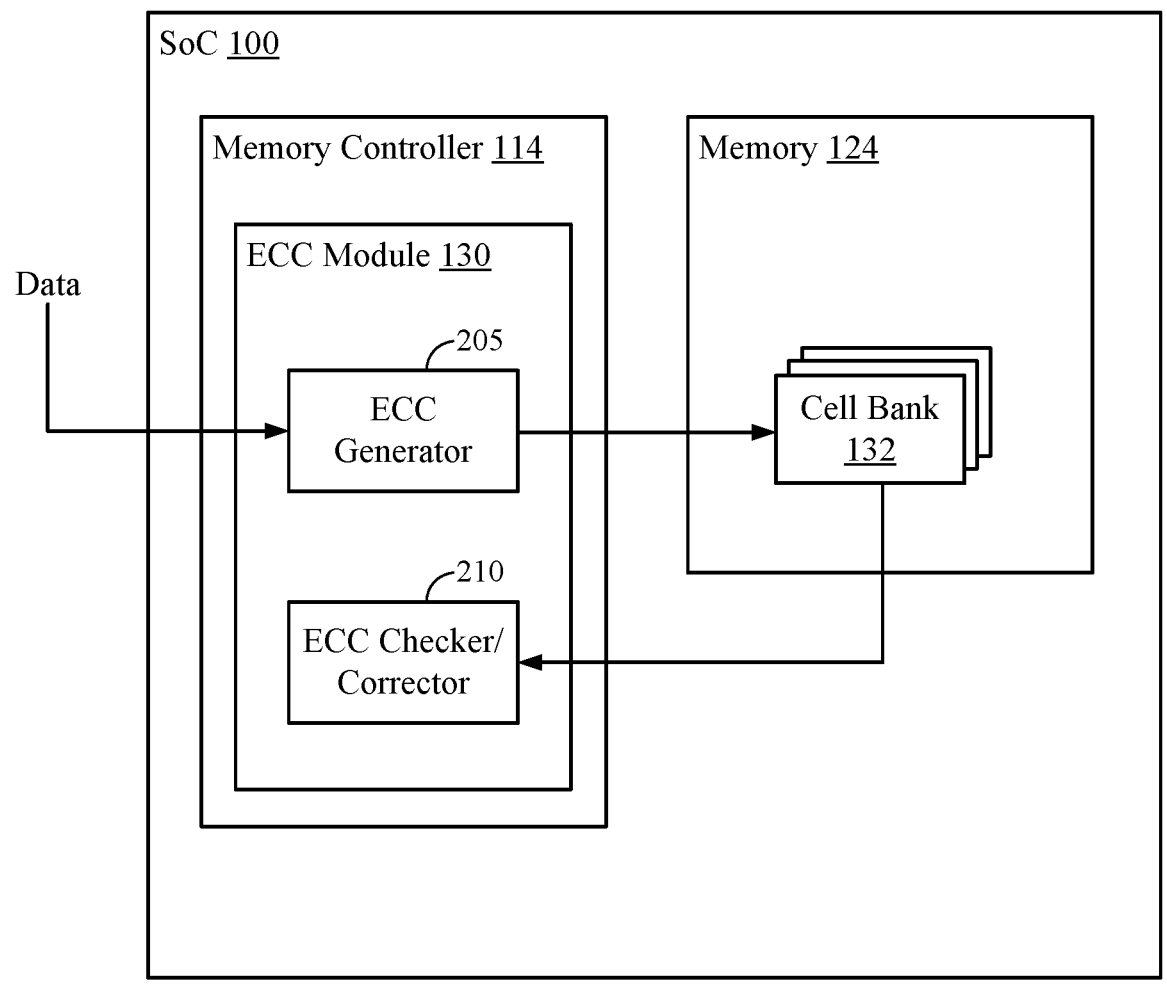
FIG. 2 illustrates example components and interconnections in the memory suitable for implementing various aspects of the present disclosure.

FIG. 2 illustrates example components and interconnections in the SoC 100 suitable for implementing various aspects of the present disclosure. As shown in FIG. 2, the memory controller 114 contains the ECC module 130. The ECC module 130 includes an ECC generator 205 and an ECC checker/corrector 210. In certain aspects, when the ECC module is operating in a normal mode, the ECC generator 205 is configured to receive data to be written to one or more cell banks 132 by, for example, a memory controller 114. The ECC generator 205 may generate checker bits (e.g., ECC parity bits) used for correcting errors in the received payload data when this payload data is written to memory 114 (e.g. in cell bank 132). These generated parity bits are also written to memory 124, in same or different cell bank 132 than payload data. The ECC generator 205, or the memory controller 114 directly, is configured to write the data to the cell bank 132, and the ECC generator 205 is further configured to write the generated checker bits corresponding to the data in cell bank(s) 132.

Upon receiving a read command for the stored data (e.g., from the memory controller 114), the ECC checker/corrector 210 is configured to read the stored data and corresponding checker bits from the cell bank 132. The ECC checker/corrector 210 is further configured to utilize the checker bits to check (e.g., using known ECC processes) if the read data includes any errors. If the read data includes any errors, the ECC checker/corrector 210 is further configured to utilize the checker bits to correct (e.g., using known ECC processes) the data. The ECC checker/corrector 210 then passes the data (e.g., checked/corrected data) to the memory controller 114 to pass to the appropriate component.

As discussed, in the case of in-line ECC, the data to be stored in the memory 124 is communicated to the memory 124 along with the corresponding ECC data for storage of both. However, prior to using in-line ECC, the memory 124 must first be initialized to enable the in-line ECC. That is, each cell of the memory 124 that is needed to store the data and the ECC data needs to be set to zero.

Figure 3:
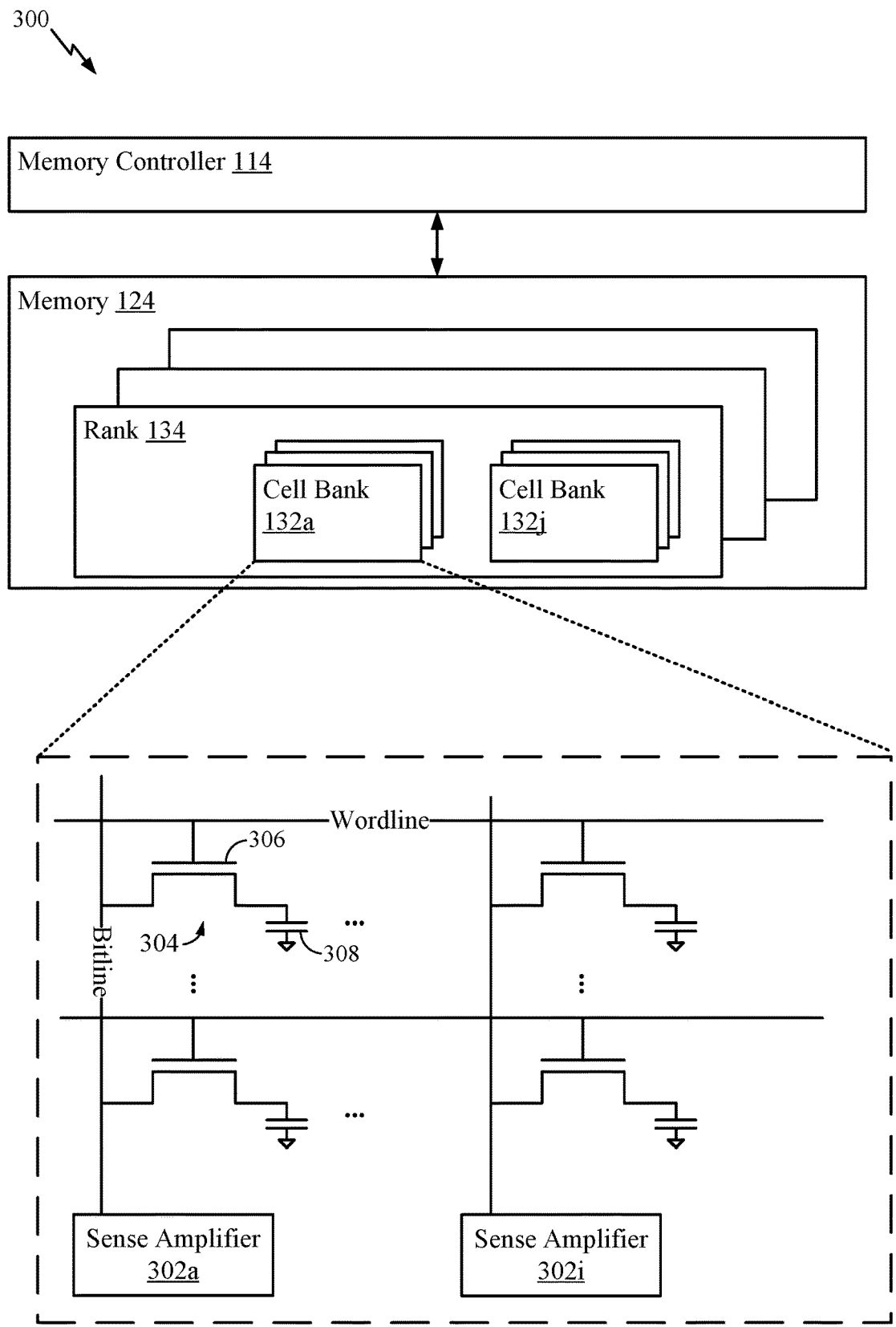
FIG. 3 is a block diagram illustrating a high-level example of a DRAM memory system suitable for implementing various aspects of the present disclosure.

FIG. 3 is a block diagram illustrating a high-level example of a DRAM memory system 300, according to aspects described herein. As discussed, the memory controller (e.g., memory controller 114 of FIG. 1) communicates via an interface with the memory (e.g., memory 124 of FIG. 1). In this example, the memory 124 includes a plurality of ranks (collectively referred to as ranks 134). Each rank 134 may include one or more sets of banks (e.g., banks 132a-132j of FIG. 1).

Each bank 132 may include an array of cells 304 organized in rows and columns. In some examples, a plurality of memory cells 304 associated with bank 132 may be organized or arranged in rows and columns, wherein each row of memory cells is associated with at least one memory cell 304 and each column of memory cells is associated with at least one memory cell 304. Each memory cell may be connected with, or coupled to an associated sense amplifier 302. In particular, the rows of memory cells may share a common wordline (WL) while the columns may share a common bit line (BL), wherein the memory cells associated with each column may be coupled to a respective sense amplifier 302. Each DRAM cell may include two components: 1) a capacitor 308 that stores one bit of data/code as electrical charge, and 2) an access transistor 306 that connects the capacitor 308 to the BL (e.g., implemented as a wire) that is shared by a respective column of cells 304. The access transistor 306 is controlled by the WL (e.g., implemented as a wire) that is shared by a respective row of cells 304. When the voltage of a WL is raised, e.g., to a power supply voltage, the respective row of cells becomes connected to the BLs, allowing reading or writing content (e.g., data or code) from/to the connected row of cells 304. The cells 304 of each column share a sense amplifier 302 configured to read or write content on the BL.

The capacitor 308 of each cell 304 is configured to store one bit of data as electrical charge. Over time, the capacitor 308 loses its charge, causing stored data to change. As a result, the memory controller 114 performs a refresh operation that periodically restores the electrical charge in the cells 304 to maintain data integrity. Each cell 304 must be refreshed periodically every refresh interval according to the DRAM type (e.g., low-power double data rate type 4 (LPDDR4), LPDDR5, etc.). Refresh operations are initiated by refresh commands issued by the memory controller 114. Generally, there are two primary refresh operations performed in modern DRAM systems: all-bank (AB) refresh (or, rank-level refresh) and per-bank (PB) refresh.

An AB refresh command may operate by refreshing one or more rows of all banks in a rank of the memory 124 concurrently. Consequently, this causes every bank 132 within the rank 134 to be unavailable to serve memory requests until the refresh command is complete. A PB refresh command may operate by refreshing a number of rows in a single bank 132 at a time. This enables a bank to be accessed while another bank 132 in the same rank 134 is being refreshed. As follows, aspects of the disclosure describe a clear content commands based on the AB refresh command.

Figure 4:
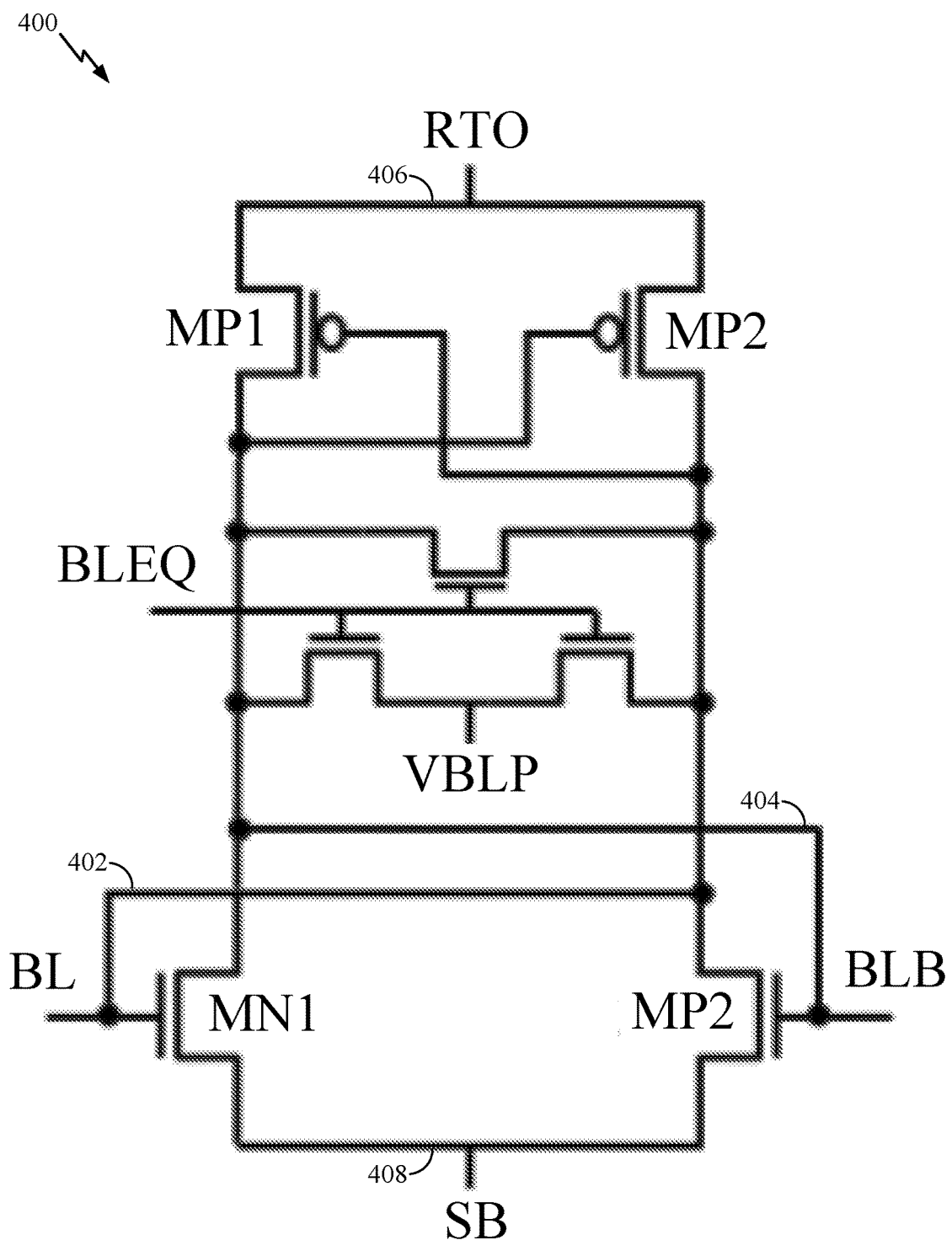
FIG. 4 is a schematic illustrating an example bit line (BL) sense amplifier suitable for implementing various aspects of the present disclosure.

FIG. 4 is a schematic illustrating an example BL sense amplifier 400 (e.g., sense amplifier 302 of FIG. 3). It should be noted that the sense amplifier of FIG. 4 serves as a general example for describing and illustrating aspects of the teachings disclosed herein. Thus, while the illustrated sense amplifier 400 may be used in the disclosed implementations, it can be appreciated that sense amplifiers having different forms and configurations may also be used. The general operation of the BL sense amplifier 400 is described as follows.

Initially, a BL 402 is precharged to a defined voltage (e.g., half of an internal power voltage, VDD). When a memory controller (e.g., memory controller 114 of FIG. 1) issues a read command to the memory (e.g., memory 124 of FIG. 1), the memory controller 114 activates control signals RTO 406 and SB 408 of the sense amplifier 400, and a charge sharing operation occurs between a charged cell capacitor (e.g., capacitor 308 of FIG. 3) and the precharged BL 402 resulting in a small voltage difference between the BL 402 and a reference BL (BLB 404). The voltage difference is amplified by the sense amplifier 400 according to the polarity of the stored content, and then the amplified voltage is transmitted to an output data buffer.

For example, if the cell capacitor 308 is low voltage (e.g., the content stored in the cell is a binary 0), a potential of the BL 402 connected to the capacitor 308 becomes lower than that of a precharge voltage, and a potential of the BLB 404 is maintained at that of the precharge voltage, so that a potential difference occurs between the two bit lines.

However, if the BL 402 and the BLB 404 are both grounded (e.g., both BL 402 and BLB 404 are tied to SB 408), the corresponding capacitor 308 is grounded and any content stored on that capacitor 308 is cleared. Thus, according to certain aspects, the memory controller 114 may receive and execute a clear content command by grounding the BL 402 and BLB 404 lines of the sense amplifier 400.

In one example, the memory controller 114 may receive a clear content command from a processor (e.g., CPU 102 of FIG. 1). The clear content command is configured to cause the memory controller 114 to activate one or more switches (e.g., transistors) of the sense amplifier 400 to clear content from one or more memory cells (e.g., memory cell 304 of FIG. 3) of one or more cell banks 132. The clear content command may include an indicator configured to identify the one or more memory cells 304 to be cleared. For example, the indicator may identify a set of banks 132 and a row of cells 304 in the set of banks 132 to be cleared. In such an example, the clear content command may clear the identified row in each bank 132 of the identified set of banks 132 simultaneously.

In response to receiving the clear content command, the memory controller 114 may activate one or more switches of each sense amplifier 400 corresponding to the one or more memory cells 304. For example, of the one or more switches, a first switch may be coupled between a first bit line (e.g., BL 402) of a corresponding column of memory cells and a ground, and a second switch may be coupled between a second bit line (e.g., BLB 404) associated with the corresponding column of memory cells 304 and the ground. Thus, by activating the first switch and the second switch, the first bit line and the second bit line are grounded, thereby clearing any contents of corresponding memory cell 304. A clear content command may be issued in response to a boot-up of a device that contains the memory 114, or a state error or a transient error detected (e.g., by one of the processors 102, 104, 106, 108, or the memory controller 114) in the memory 124.

Example Techniques for Implementing a Command Address Clear Content Command

Examples described herein provides techniques and methods for implementing a clear content command to clear memory cells in a memory 124. In certain aspects, a single clear content command can clear the same row of each bank in the plurality of banks. In some examples, the clear content command is executed by the memory control 114, and is configured to activate one or more switches (e.g., transistors) in the sense amplifier 400 to ground the BL 402 and BLB 404. By grounding both the BL 402 and BLB 404, any stored contents of a corresponding cell 304 are cleared (e.g., set the cell to 0 volts).

In certain aspects, the memory controller 114 receives a clear content command over a command address (CA) bus. In some examples, the clear content command may be encoded according to the type of memory 124. For instance, if the memory 124 is an LPDDR4 type, the clear content command may be encoded as a two phase single data rate (SDR) command. If, in some examples, the memory 124 is an LPDDR5 type, the clear content command may be encoded as a two phase double data rate (DDR) command. In certain examples that follow, a first phase of the clear content command includes a first sequence of bits, and the second phase of the clear content command includes a second sequence of bits complementary to the first sequence of bits.

FIG. 5A is a first block diagram illustrating example CA encoding of a clear content command 502. It is appreciated that the command values illustrated are examples, and may be changed to different values. For example, the clear content command 502 may include a single phase command, and the signaling on each bit of the CA bus can be set to any suitable complementary or non-complementary configuration. Moreover, the number of bits used for encoding the clear content command 502 may include more or less bits to accommodate any suitable bit size of the CA bus.

In this example, the clear content command 502 is a six-bit, SDR two-phase command communicated via a six-bit CA bus. In this example, the first phase 504 is a low-high-low-high-low-high combination of bits communicated on a first rising clock edge (R1). The second phase 506 is a high-low-high-low-high-low combination of bits communicated on a second rising clock edge (R2) (e.g., the rising clock edge following R1). That is, the first phase command is received by the memory controller 114 prior to the second phase of the command, wherein the second phase of the command is complementary to the first phase of the command. As such, the two phase command as illustrated is a complementary command format. The complementary command format may provide additional protection from transient errors on the CA bus by alternating the signal between low and high for each bit in successive phases of a command.

FIG. 5B is a second block diagram illustrating example CA encoding of a clear content command 522. It is appreciated that the command values illustrated are examples, and may be changed to different values. For example, the clear content command 522 may include a single phase command, and the signaling on each bit of the CA bus can be set to any suitable complementary or non-complementary configuration. Moreover, the number of bits used for encoding the clear content command 522 may increase or decrease to accommodate any bit size of the CA bus.

In this example, the clear content command 522 is a six-bit, DDR two-phase command communicated via a six-bit CA bus. In this example, the first phase 524 is a low-low-low-high-high-high combination of bits communicated on a first rising clock edge (R1). The second phase 526 is a high-high-high-low-low-low combination of bits communicated on a first falling clock edge (F2) (e.g., the falling clock edge immediately following R1). That is, the first phase command is received by the memory controller 114 prior to the second phase of the command. Such a complementary command format may provide additional protection from transient errors on the CA bus.

Example Techniques for Implementing a Mode Register Write Clear Content Command

In some examples, the clear content command may be written to a mode register. The memory controller 114 may then read the mode register according to a periodic interval and execute the clear content command. For example, an application or processor issuing the command may need to write a particular multi-bit sequence (e.g., 0xA5) into the register. Once the memory controller 114 reads and executes the clear content command, the memory controller 114 may clear the mode register.

Figure 6:
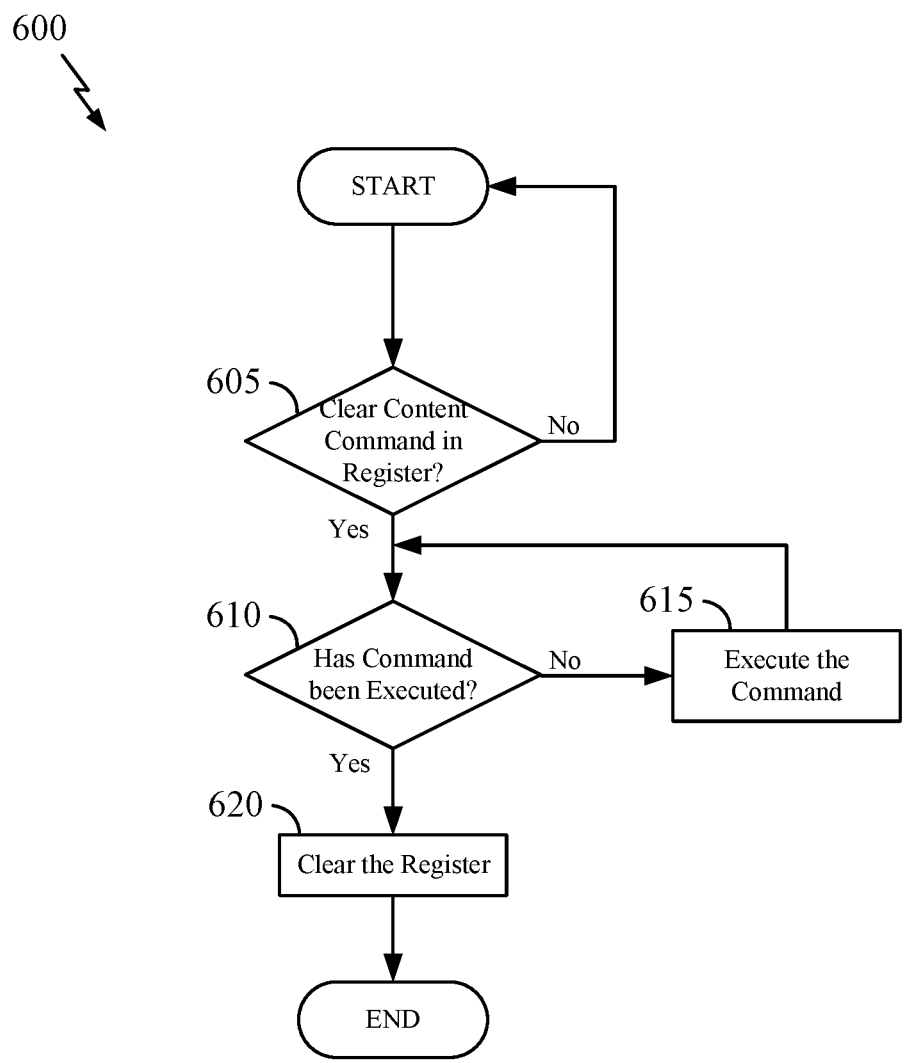
FIG. 6 is a flow chart illustrating an example process for executing a clear content command in a mode register suitable for implementing various aspects of the present disclosure.

FIG. 6 is a flow chart illustrating an example process 600 for executing a clear content command in a mode register. Initially, the memory controller 114 may periodically/aperiodically check the content of the mode register. At block 605, the memory controller 114 determines if a clear content command has been written to the register. If no command has been written to the register, then the memory controller 114 may wait until the next periodic time interval to check the register, or until it receives a notification of new content in the mode register.

If a clear content command has been written to the mode register, then, at block 610, the memory controller 114 may determine whether the clear content command has been executed. In some examples, the memory controller 114 may determine if the rows corresponding to the clear content command have been cleared in all the banks. If the clear content command has not been executed, the process 600 may advance to block 615 where the memory controller 114 executes the clear content command. If the clear content command has already been executed, the process 600 may proceed to block 620 where the memory controller 114 clears the mode register.

It should be noted that in both examples illustrated in FIGS. 5A and 5B, the memory controller 114 may execute the clear content command upon receipt of the command via the CA bus. However, in FIG. 6, the memory controller 114 may not be required to execute clear content command immediately. For example, the memory controller 114 may only check the content of the mode register periodically. It should also be noted, that the memory controller 114 may operate normally while the mode registers are written to. This may be a preferred method for communicating a clear content command if the CA bus is relatively busy.

As discussed, upon receiving the clear content command, the memory controller 114 may execute the command by activating one or more switches of a sense amplifier of the memory 124 to ground BL 402 and BLB 404, and clear the content of each memory cell in a row of a bank 132 for all banks 132 simultaneously. As noted previously, a sense amplifier 400 may come in many configurations, having less or additional components relative to those shown in FIG. 4.

Figure 7:
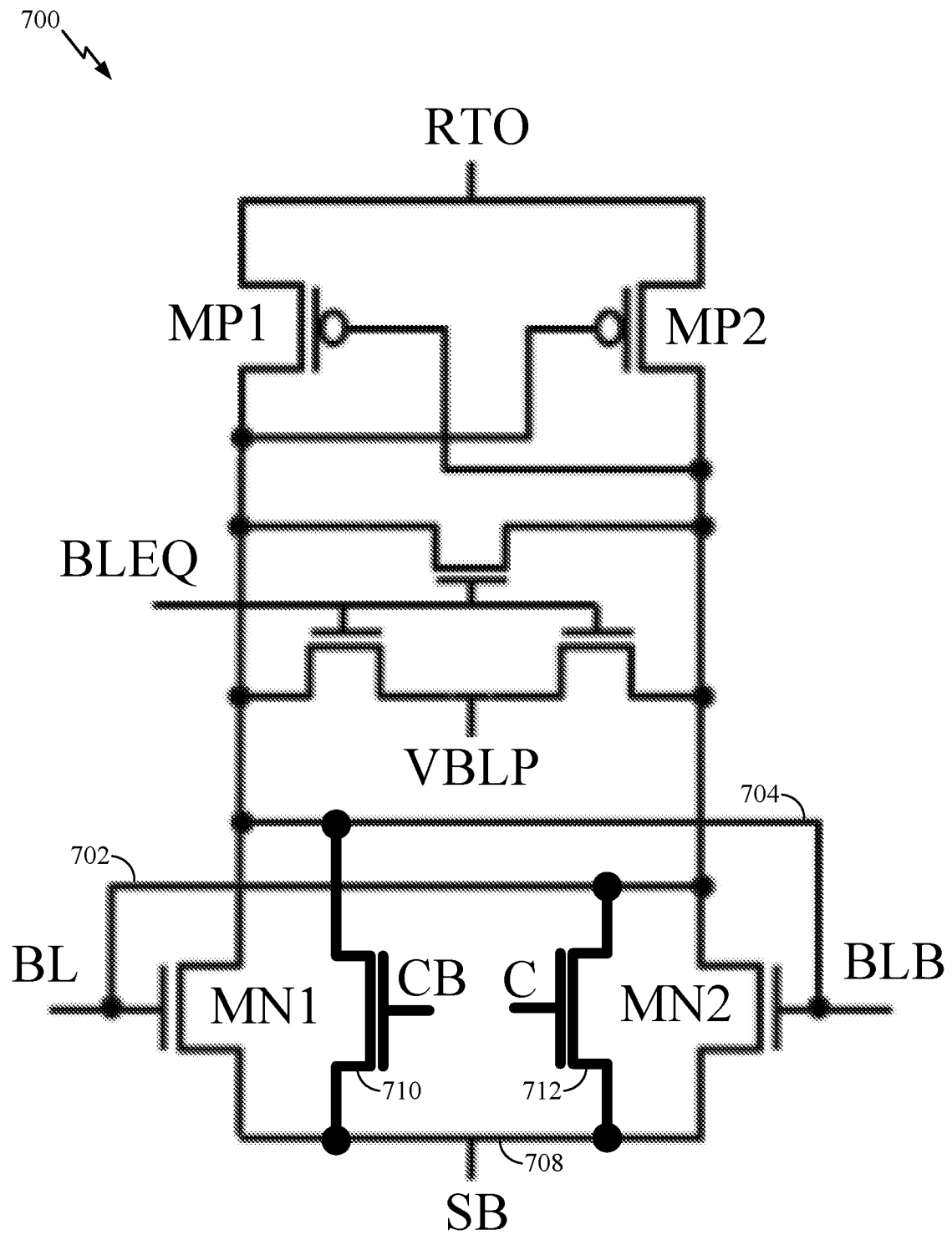
FIG. 7 is a schematic illustrating a first example sense amplifier with two additional switches suitable for implementing various aspects of the present disclosure.

For example, FIG. 7 is a schematic illustrating an example sense amplifier 700 with two additional switches 710, 712 relative to the sense amplifier 400 of FIG. 4. In this example, the BL 702 and the BLB 704 are coupled to SB 708 (e.g., ground) via a first switch 710 and a second switch 712. Thus, to execute the clear content command, the memory controller 114 may activate one of the switches at the gate of the switch using a clear command signal (e.g., shown in FIG. 7 as "CB" or "C"), thereby grounding the BL 702 or BLB 704, and clearing a corresponding memory cell. For example, only one transistor may need to be enabled (e.g., the gate of the transistor activated). Here, the first switch 710 corresponding to the BL 702 that is driven by a memory cell must be activated when memory cell is driving the BL 702 (e.g., clear command signal "C" is activated to clear the memory cell). BLB is then used as a reference level line for the sense-amplifier 700. Alternatively, when the memory cell is driving BLB 704, then the clear command signal "CB" is activated to clear the memory cell.

In the example of FIG. 7, the first switch 710 and the second switch 712 may be switches that already exist on the sensing amplifier 700 for purposes unrelated to the clear content command. In such a case, the switches may be repurposed for execution of the clear content command. In some examples, a combination of switches that already exist on a sensing amplifier may be repurposed for execution of the clear content command.

Figure 8:
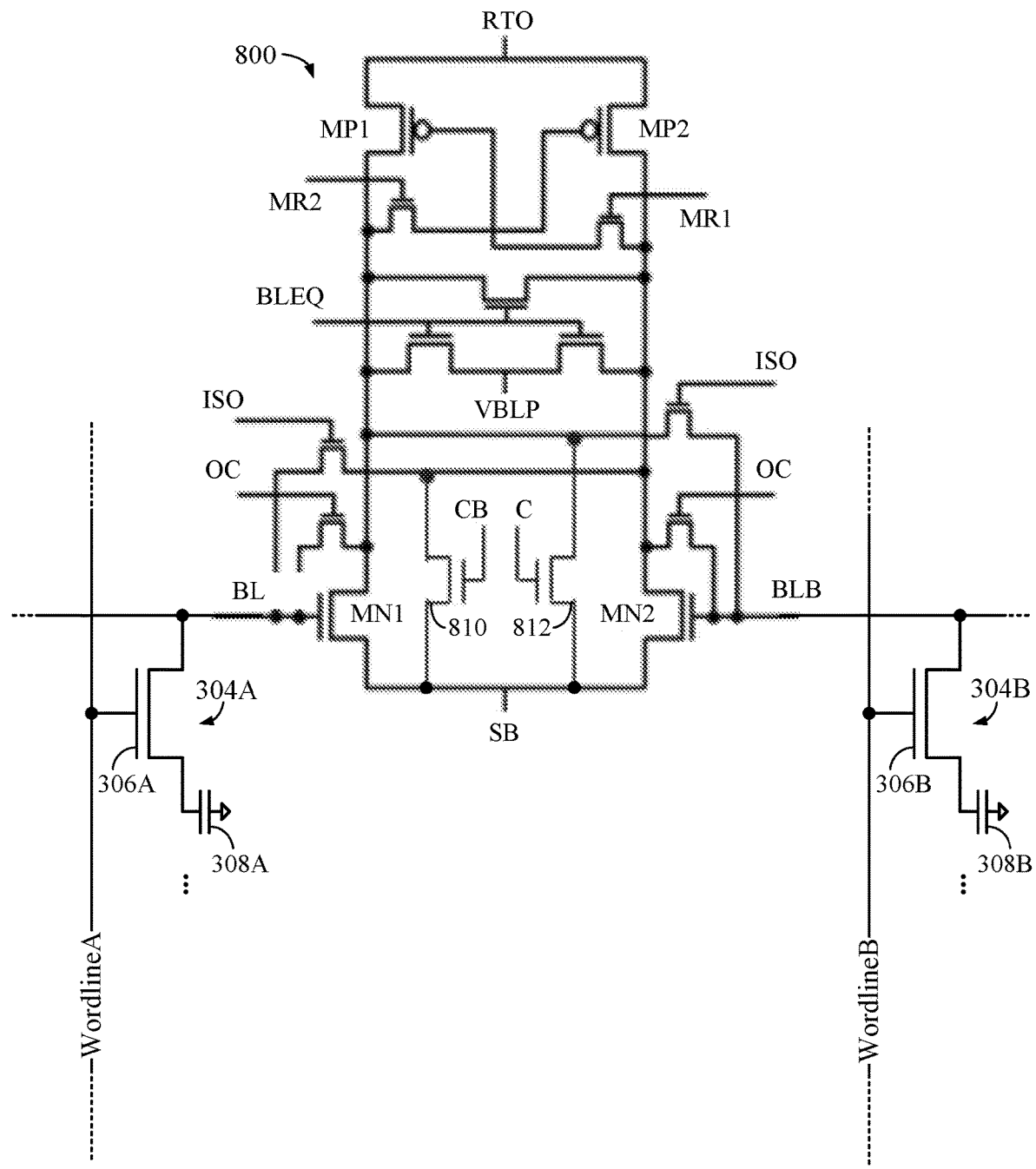
FIG. 8 is a schematic illustrating a second example sense amplifier with two additional switches suitable for implementing various aspects of the present disclosure.

FIG. 8 is a schematic illustrating another example sense amplifier 800 with two additional switches suitable for implementing various aspects of the present disclosure. As discussed, sense amplifiers may be found in many different forms, each comprising additional or fewer components, or different configurations. For example, the sense amplifier 800 of FIG. 8 includes more components than the sense amplifier 700 of FIG. 7.

In this example, a first memory cell 304A is coupled to a bit line (BL) of the sense amplifier 800 and a first word line (WordlineA). A BLB of the sense amplifier 800 is also coupled to a second word line (WordlineB). Sense amplifier 800 is connected to both bit lines (BL and BLB) which are each connected to a memory cell array that includes a first memory cell 304A and a second memory cell 304B. As discussed, sense amplifier 800 may sense a voltage change of an activated BL (e.g., activated by WordlineA) among the bit lines and amplifies the voltage change to produce output data. In this example, sense amplifier 800 receives an isolation signal (ISO) configured to cause the sense amplifier to perform a memory refresh operation. Similarly, sense amplifier 800 may sense a voltage change of an activated BLB (e.g., activated by WordlineB) among the bit lines Here, a first switch 810 is coupled between a first ISO line and a ground (e.g., SB), and a second switch 812 is coupled between a second ISO line and the ground. Both of the first switch 810 and the second switch 812 are configured to receive a clear command from the memory controller 114. In this example, the clear command (e.g., "C" or "CB") may activate the corresponding gate of the first switch or the second switch, and force to ground the BL or the BLB during a refresh cycle (e.g., when an ISO signal activates the first ISO line and the second ISO line) which forces the first memory cell 304 or the second memory cell 304B (and any other memory cells in the memory cell array associated with the first memory cell 304 or the second memory cell 304B) to ground, thereby clearing the memory cells. Accordingly, in this particular example, the refresh command of the sense amplifier 800 may be repurposed as a clear command with the addition of one extra transistor per bit line in the sense amplifier 800.

Figure 9:
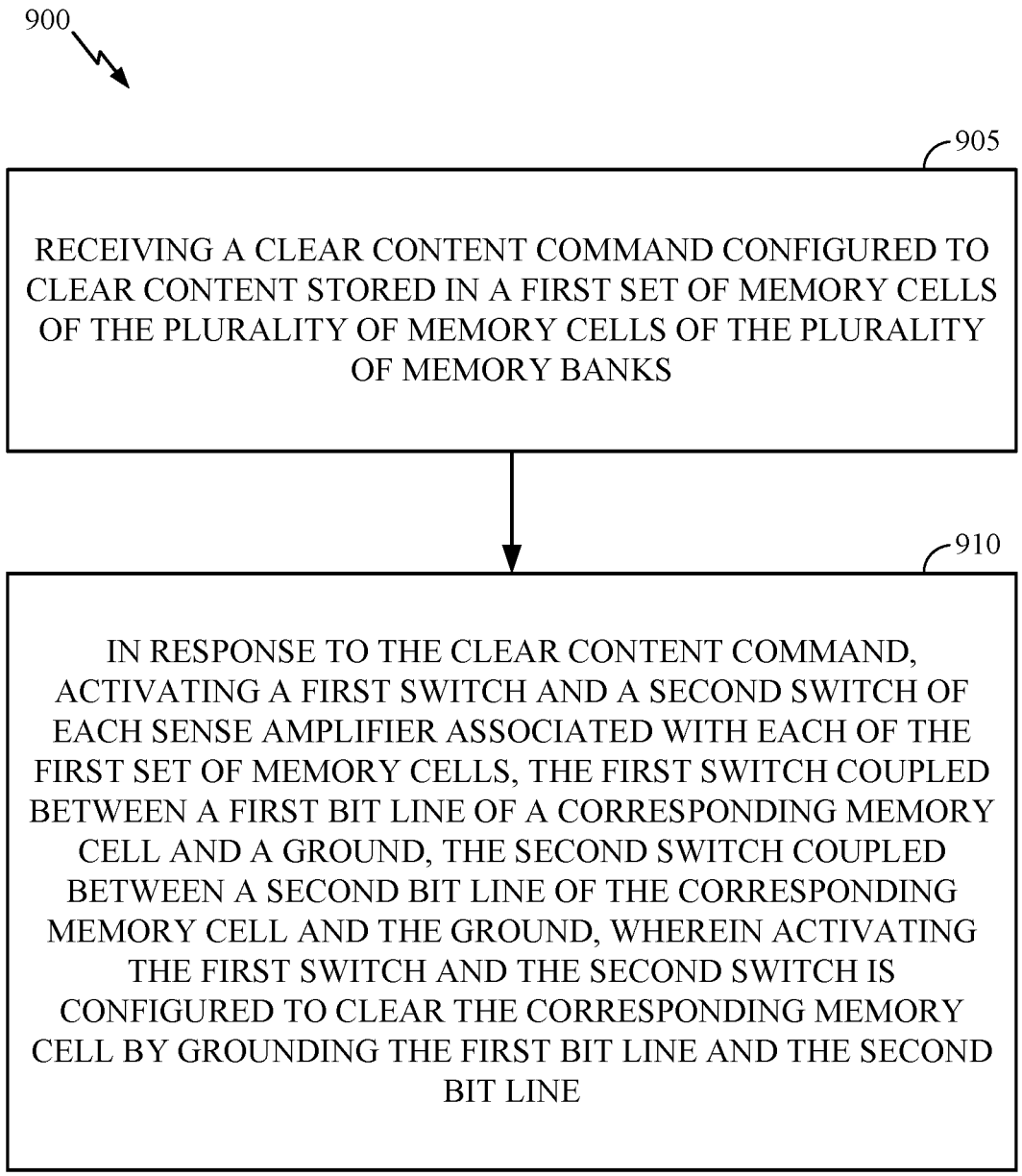
FIG. 9 is a flow chart that illustrates example operations for clearing content stored on a memory of an electronic device, suitable for implementing various aspects of the present disclosure.

FIG. 9 is a flow chart that illustrates example operations 900 for clearing content stored on a memory of an electronic device, in accordance with certain aspects of the present disclosure. For example, the steps of operations of FIG. 9 may be performed by the memory controller (e.g., memory controller 114 of FIG. 1), or another suitable circuit.

The operations 900 begin at step 905 by receiving a clear content command configured to clear content stored in a first set of memory cells of the plurality of memory cells of the plurality of memory banks.

The operations 900 may proceed at step 910 by, in response to the clear content command, activating a first switch and a second switch of each sense amplifier associated with each of the first set of memory cells, the first switch coupled between a first bit line of a corresponding memory cell and a ground, the second switch coupled between a second bit line of the corresponding memory cell and the ground, wherein activating the first switch and the second switch is configured to clear the corresponding memory cell by grounding the first bit line and the second bit line.

In certain aspects, the clear content command comprises a first phase command and a second phase command, the first phase command comprising a first sequence of bits, and the second phase command having a second sequence of bits complementary to the first sequence of bits.

In certain aspects, receiving the clear content command comprises receiving the first phase command prior to receiving the second phase command.

In certain aspects, receiving the clear content command comprises reading a multi-bit command stored in a mode register.

In certain aspects, the operations 900 include clearing the mode register in response to a determination that the content of the first set of memory cells has been cleared.

In certain aspects, the memory is a dynamic random-access memory (DRAM) utilizing in-line error correction code (ECC).

In certain aspects, the controller receives the command in response to an event comprising one or more of: a boot-up of the electronic device; a state error detected in the memory; or a transient error detected in the memory.

In certain aspects, the clear content command includes an indicator configured to identify the first set of memory cells.

In certain aspects, the first set of memory cells comprise at least one row of memory cells in each memory bank of the plurality of memory banks. In certain optional aspects, the first set of memory cells comprise two or more rows of memory cells in each memory bank. In certain optional aspects, the first set of memory cells comprise all rows of memory cells in a memory bank. By addressing multiple or all rows in a memory bank, the memory cells of multiple rows or of the entire memory bank are cleared simultaneously. In these examples, the voltage of the respective multiple or word lines is raised, e.g. to a power supply voltage.

Figure 10:
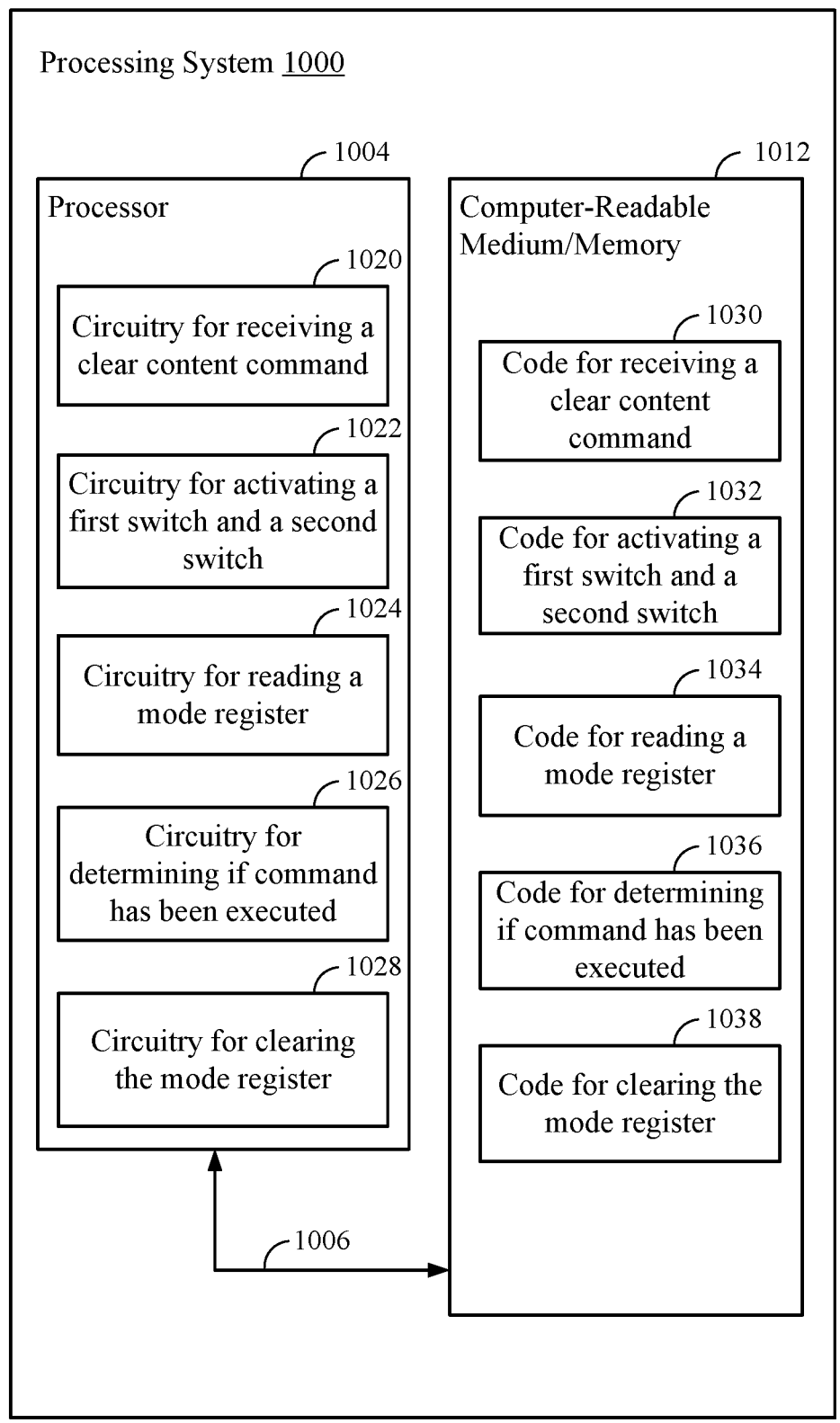
FIG. 10 illustrates a processing system that may include various components (e.g., corresponding to means-plus-function components) configured to perform operations for the techniques disclosed herein.

FIG. 10 illustrates a processing system 1000 that may include various components (e.g., corresponding to means-plus-function components) configured to perform operations for the techniques disclosed herein, such as the operations illustrated in FIGS. 6 and 8. The processing system 1000 includes a processor 1004 coupled to a computer-readable medium/memory 1012 via a bus 1006. In certain aspects, the computer-readable medium/memory 1012 is configured to store instructions (e.g., computer-executable code) that when executed by the processor 1004, cause the processor 1004 to perform the operations illustrated in FIGS. 6 and 8, or other operations for performing the various techniques discussed herein for memory arbitration.

In certain aspects, computer-readable medium/memory 1012 stores code 1030 for receiving a clear content command configured to clear content stored in a first set of memory cells of the plurality of memory cells of the plurality of memory banks; code 1032 for, in response to the clear content command, activating a first switch and a second switch of each sense amplifier associated with each of the first set of memory cells, the first switch coupled between a first bit line of a corresponding memory cell and a ground, the second switch coupled between a second bit line of the corresponding memory cell and the ground, wherein activating the first switch and the second switch is configured to clear the corresponding memory cell by grounding the first bit line and the second bit line; code 1034 for reading a mode register to determine if a multi-bit command is stored in the mode register; code 1036 for determining if the command stored in the mode register has been executed; and code 1038 for clearing the mode register upon the determination that the command store in the mode register has been executed.

In certain aspects, the processor 1004 has circuitry configured to implement the code stored in the computer-readable medium/memory 1012. The processor 1004 includes circuitry 1020 for receiving a clear content command configured to clear content stored in a first set of memory cells of the plurality of memory cells of the plurality of memory banks; circuitry 1022 for, in response to the clear content command, activating a first switch and a second switch of each sense amplifier associated with the respective one of each of the first set of memory cells, the first switch coupled between a first bit line of a corresponding memory cell and a ground, the second switch coupled between a second bit line of the corresponding memory cell and the ground, wherein activating the first switch and the second switch is configured to clear the corresponding memory cell by grounding the first bit line and the second bit line; circuitry 1024 for reading a mode register to determine if a multi-bit command is stored in the mode register; circuitry 1026 for determining if the command stored in the mode register has been executed; and circuitry 1028 for clearing the mode register upon the determination that the command store in the mode register has been executed.

Example Aspects

In a first aspect, a method of clearing content stored on a memory of an electronic device, the memory comprising a plurality of memory banks on each of which a plurality of memory cells are arranged, each of the plurality of memory cells coupled to an associated sense amplifier, the method comprising: receiving a clear content command configured to clear content stored on the memory in a first set of memory cells of the plurality of memory cells of the plurality of memory banks; and in response to the clear content command, activating a first switch and a second switch of each sense amplifier associated with each of the first set of memory cells, the first switch coupled between a first bit line of a corresponding memory cell and a ground, the second switch coupled between a second bit line of the corresponding memory cell and the ground, wherein activating the first switch and the second switch is configured to clear the corresponding memory cell by grounding the first bit line and the second bit line.

In a second aspect, alone or in combination with the first aspect, the clear content command comprises a first phase command and a second phase command, the first phase command comprising a first sequence of bits, and the second phase command having a second sequence of bits complementary to the first sequence of bits.

In a third aspect, alone or in combination with one or more of the first aspect and the second aspect, receiving the clear content command comprises receiving the first phase command prior to receiving the second phase command.

In a fourth aspect, alone or in combination with one or more of the first through third aspects, receiving the clear content command comprises reading a multi-bit command stored in a mode register.

In a fifth aspect, alone or in combination with one or more of the first through fourth aspects, further comprising clearing the mode register in response to a determination that the content of the first set of memory cells has been cleared.

In a sixth aspect, alone or in combination with one or more of the first through fifth aspects, the memory is a dynamic random-access memory (DRAM) utilizing in-line error correction code (ECC).

In a seventh aspect, alone or in combination with one or more of the first through sixth aspects, the controller receives the command in response to an event comprising one or more of: a boot-up of the electronic device; a state error detected in the memory; or a transient error detected in the memory.

In an eighth aspect, alone or in combination with one or more of the first through seventh aspects, the clear content command includes an indicator configured to identify the first set of memory cells.

In a ninth aspect, alone or in combination with one or more of the first through eighth aspects, the first set of memory cells comprise at least one row of memory cells in each memory bank of the plurality of memory banks.

In a tenth aspect, a device, comprising: a memory comprising a plurality of memory banks on each of which a plurality of memory cells are arranged, each of the plurality of memory cells coupled to an associated sense amplifier; and a processor communicatively coupled to the memory configured to: receive a clear content command configured to clear content stored on a first set of memory cells of the plurality of memory cells of the plurality of memory banks; and in response to the clear content command, activate a first switch and a second switch of each sense amplifier associated with each of the first set of memory cells, the first switch coupled between a first bit line of a corresponding memory cell and a ground, the second switch coupled between a second bit line of the corresponding memory cell and the ground, wherein activating the first switch and the second switch is configured to clear the corresponding memory cell by grounding the first bit line and the second bit line.

In an eleventh aspect, alone or in combination with the tenth aspect, the clear content command comprises a first phase command and a second phase command, the first phase command comprising a first sequence of bits, and the second phase command having a second sequence of bits complementary to the first sequence of bits.

In a twelfth aspect, alone or in combination with one or more of the tenth and eleventh aspects, the processor, being configured to receive the clear content command, is further configured to receive the first phase command prior to receiving the second phase command.

In a thirteenth aspect, alone or in combination with one or more of the tenth through twelfth aspects, the processor, being configured to receive the clear content command, is further configured to read a multi-bit command stored in a mode register.

In a fourteenth aspect, alone or in combination with one or more of the tenth through thirteenth aspects, the processor is further configured to clear the mode register in response to a determination that the content of the first set of memory cells has been cleared.

In a fifteenth aspect, alone or in combination with one or more of the tenth through fourteenth aspects, the memory is a dynamic random-access memory (DRAM) utilizing in-line error correction code (ECC).

In a sixteenth aspect, alone or in combination with one or more of the tenth through fifteenth aspects, the command is received in response to an event comprising one or more of: a boot-up of the electronic device; a state error detected in the memory; or a transient error detected in the memory.

In a seventeenth aspect, alone or in combination with one or more of the tenth through sixteenth aspects, the clear content command includes an indicator configured to identify the first set of memory cells.

In an eighteenth aspect, alone or in combination with one or more of the tenth through seventeenth aspects, the first set of memory cells comprise at least one row of memory cells in each memory bank of the plurality of memory banks.

In a nineteenth aspect, an apparatus configured to clear content stored on a memory of an electronic device, the memory comprising a plurality of memory banks on each of which a plurality of memory cells are arranged, each of the plurality of memory cells coupled to an associated sense amplifier, the apparatus comprising: means for receiving a clear content command configured to clear content stored on a first set of memory cells of the plurality of memory cells of the plurality of memory banks; and in response to the clear content command, means for activating a first switch and a second switch of each sense amplifier associated with each of the first set of memory cells, the first switch coupled between a first bit line of a corresponding memory cell and a ground, the second switch coupled between a second bit line of the corresponding memory cell and the ground, wherein activating the first switch and the second switch is configured to clear the corresponding memory cell by grounding the first bit line and the second bit line.

In a twentieth aspect, alone or in combination with the nineteenth aspect, the clear content command comprises a first phase command and a second phase command, the first phase command comprising a first sequence of bits, and the second phase command having a second sequence of bits complementary to the first sequence of bits.

In a twenty-first aspect, alone or in combination with one or more of the nineteenth aspect and the twentieth aspect, the means for receiving the clear content command comprises a means for receiving the first phase command prior to the second phase command.

In a twenty-second aspect, alone or in combination with one or more of the nineteenth aspect through the twenty-first aspect, the means for receiving the clear content command comprises a means for reading a multi-bit command stored in a mode register.

In a twenty-third aspect, alone or in combination with one or more of the nineteenth aspect through the twenty-second aspect, further comprising means for clearing the mode register in response to a determination that the content of the first set of memory cells has been cleared.

In a twenty-fourth aspect, alone or in combination with one or more of the nineteenth aspect through the twenty-third aspect, the memory is a dynamic random-access memory (DRAM) utilizing in-line error correction code (ECC).

In a twenty-fifth aspect, alone or in combination with one or more of the nineteenth aspect through the twenty-fourth aspect, the command is received in response to an event comprising one or more of: a boot-up of the apparatus; a state error detected in the memory; or a transient error detected in the memory.

In a twenty-sixth aspect, alone or in combination with one or more of the nineteenth aspect through the twenty-fifth aspect, the clear content command includes an indicator configured to identify the first set of memory cells.

In a twenty-seventh aspect, alone or in combination with one or more of the nineteenth aspect through the twenty-sixth aspect, the first set of memory cells comprise at least one row of memory cells in each memory bank of the plurality of memory banks.

In a twenty-eighth aspect, a non-transitory computer-readable storage medium that stores instructions that when executed by a processor of an apparatus cause the apparatus to perform a method of clearing content stored on a memory of an electronic device, the memory comprising a plurality of memory banks on each of which a plurality of memory cells are arranged, each of the plurality of memory cells coupled to an associated sense amplifier, the method comprising: receiving, by the apparatus, a clear content command configured to clear content stored on a first set of memory cells of the plurality of memory cells of the plurality of memory banks; and in response to the clear content command, activating, by the apparatus, a first switch and a second switch of each sense amplifier associated with each of the first set of memory cells, the first switch coupled between a first bit line of a corresponding memory cell and a ground, the second switch coupled between a second bit line of the corresponding memory cell and the ground, wherein activating the first switch and the second switch is configured to clear the corresponding memory cell by grounding the first bit line and the second bit line.

In a twenty-ninth aspect, alone or in combination with the twenty-eighth aspect, the clear content command comprises a first phase command and a second phase command, the first phase command comprising a first sequence of bits, and the second phase command having a second sequence of bits complementary to the first sequence of bits.

In a thirtieth aspect, alone or in combination with one or more of the twenty-eighth aspects and the twenty-ninth aspect, receiving the clear content command comprises receiving the first phase command prior to receiving the second phase command.

Additional Information

The preceding description is provided to enable any person skilled in the art to practice the various embodiments described herein. Various modifications to these embodiments will be readily apparent to those skilled in the art, and the generic principles defined herein may be applied to other embodiments. For example, changes may be made in the function and arrangement of elements discussed without departing from the scope of the disclosure. Various examples may omit, substitute, or add various procedures or components as appropriate. Also, features described with respect to some examples may be combined in some other examples. For example, an apparatus may be implemented or a method may be practiced using any number of the aspects set forth herein. In addition, the scope of the disclosure is intended to cover such an apparatus or method that is practiced using other structure, functionality, or structure and functionality in addition to, or other than, the various aspects of the disclosure set forth herein. It should be understood that any aspect of the disclosure disclosed herein may be embodied by one or more elements of a claim.

As used herein, the word "exemplary" means "serving as an example, instance, or illustration." Any aspect described herein as "exemplary" is not necessarily to be construed as preferred or advantageous over other aspects.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

The methods disclosed herein comprise one or more steps or actions for achieving the methods. The method steps and/or actions may be interchanged with one another without departing from the scope of the claims. In other words, unless a specific order of steps or actions is specified, the order and/or use of specific steps and/or actions may be modified without departing from the scope of the claims. Further, the various operations of methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

The various illustrative logical blocks, modules and circuits described in connection with the present disclosure may be implemented or performed with a general purpose processor, a digital signal processor (DSP), an application specific integrated circuit (ASIC), a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

A processing system may be implemented with a bus architecture. The bus may include any number of interconnecting buses and bridges depending on the specific application of the processing system and the overall design constraints. The bus may link together various circuits including a processor, machine-readable media, and input/output devices, among others. A user interface (e.g., keypad, display, mouse, joystick, etc.) may also be coupled to the bus. The bus may also link various other circuits such as timing sources, peripherals, voltage regulators, power management circuits, and the like, which are well known in the art, and therefore, will not be described any further. The processor may be implemented with one or more general-purpose and/or special-purpose processors. Examples include microprocessors, microcontrollers, DSP processors, and other circuitry that can execute software. Those skilled in the art will recognize how best to implement the described functionality for the processing system depending on the particular application and the overall design constraints imposed on the overall system.

If implemented in software, the functions may be stored or transmitted over as one or more instructions or code on a computer-readable medium. Software shall be construed broadly to mean instructions, data, or any combination thereof, whether referred to as software, firmware, middleware, microcode, hardware description language, or otherwise. Computer-readable media include both computer storage media and communication media, such as any medium that facilitates transfer of a computer program from one place to another. The processor may be responsible for managing the bus and general processing, including the execution of software modules stored on the computer-readable storage media. A computer-readable storage medium may be coupled to a processor such that the processor can read information from, and write information to, the storage medium. In the alternative, the storage medium may be integral to the processor. By way of example, the computer-readable media may include a transmission line, a carrier wave modulated by data, and/or a computer readable storage medium with instructions stored thereon separate from the wireless node, all of which may be accessed by the processor through the bus interface. Alternatively, or in addition, the computer-readable media, or any portion thereof, may be integrated into the processor, such as the case may be with cache and/or general register files. Examples of machine-readable storage media may include, by way of example, RAM (Random Access Memory), flash memory, ROM (Read Only Memory), PROM (Programmable Read-Only Memory), EPROM (Erasable Programmable Read-Only Memory), EEPROM (Electrically Erasable Programmable Read-Only Memory), registers, magnetic disks, optical disks, hard drives, or any other suitable storage medium, or any combination thereof. The machine-readable media may be embodied in a computer-program product.

A software module may comprise a single instruction, or many instructions, and may be distributed over several different code segments, among different programs, and across multiple storage media. The computer-readable media may comprise a number of software modules. The software modules include instructions that, when executed by an apparatus such as a processor, cause the processing system to perform various functions. The software modules may include a transmission module and a receiving module. Each software module may reside in a single storage device or be distributed across multiple storage devices. By way of example, a software module may be loaded into RAM from a hard drive when a triggering event occurs. During execution of the software module, the processor may load some of the instructions into cache to increase access speed. One or more cache lines may then be loaded into a general register file for execution by the processor. When referring to the functionality of a software module, it will be understood that such functionality is implemented by the processor when executing instructions from that software module.

The following claims are not intended to be limited to the embodiments shown herein, but are to be accorded the full scope consistent with the language of the claims. Within a claim, reference to an element in the singular is not intended to mean "one and only one" unless specifically so stated, but rather "one or more." Unless specifically stated otherwise, the term "some" refers to one or more. No claim element is to be construed under the provisions of 35 U.S.C. § 112(f) unless the element is expressly recited using the phrase "means for" or, in the case of a method claim, the element is recited using the phrase "step for." All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims.

What is claimed is:

1. A method of clearing content stored on a memory of an electronic device, the memory comprising a plurality of memory banks on each of which a plurality of memory cells are arranged, each of the plurality of memory cells coupled to an associated sense amplifier, the method comprising:
   receiving a clear content command configured to clear content stored on the memory in a first set of memory cells of the plurality of memory cells of the plurality of memory banks; and
   in response to the clear content command, activating a first switch and a second switch of each sense amplifier associated with each of the first set of memory cells, the first switch coupled between a first bit line of a corresponding memory cell and a ground, the second switch coupled between a second bit line of the corresponding memory cell and the ground, wherein activating the first switch and the second switch is configured to clear the corresponding memory cell by grounding the first bit line and the second bit line.

2. The method of claim 1, wherein the clear content command comprises a first phase command and a second phase command, the first phase command comprising a first sequence of bits, and the second phase command having a second sequence of bits complementary to the first sequence of bits.

3. The method of claim 2, wherein receiving the clear content command comprises receiving the first phase command prior to receiving the second phase command.

4. The method of claim 1, wherein receiving the clear content command comprises reading a multi-bit command stored in a mode register.

5. The method of claim 4, further comprising clearing the mode register in response to a determination that the content of the first set of memory cells has been cleared.

6. The method of claim 1, wherein the memory is a dynamic random-access memory (DRAM) utilizing in-line error correction code (ECC).

7. The method of claim 1, wherein the controller receives the command in response to an event comprising one or more of:
 a boot-up of the electronic device;
 a state error detected in the memory; or
 a transient error detected in the memory.

8. The method of claim 1, wherein the clear content command includes an indicator configured to identify the first set of memory cells.

9. The method of claim 1, wherein the first set of memory cells comprise at least one row of memory cells in each memory bank of the plurality of memory banks.

10. A device, comprising:
 a memory comprising a plurality of memory banks on each of which a plurality of memory cells are arranged, each of the plurality of memory cells coupled to an associated sense amplifier; and
 a processor communicatively coupled to the memory configured to:
  receive a clear content command configured to clear content stored on a first set of memory cells of the plurality of memory cells of the plurality of memory banks; and
  in response to the clear content command, activate a first switch and a second switch of each sense amplifier associated with each of the first set of memory cells, the first switch coupled between a first bit line of a corresponding memory cell and a ground, the second switch coupled between a second bit line of the corresponding memory cell and the ground, wherein activating the first switch and the second switch is configured to clear the corresponding memory cell by grounding the first bit line and the second bit line.

11. The device of claim 10, wherein the clear content command comprises a first phase command and a second phase command, the first phase command comprising a first sequence of bits, and the second phase command having a second sequence of bits complementary to the first sequence of bits.

12. The device of claim 11, wherein the processor, being configured to receive the clear content command, is further configured to receive the first phase command prior to receiving the second phase command.

13. The device of claim 10, wherein the processor, being configured to receive the clear content command, is further configured to read a multi-bit command stored in a mode register.

14. The device of claim 13, wherein the processor is further configured to clear the mode register in response to a determination that the content of the first set of memory cells has been cleared.

15. The device of claim 10, wherein the memory is a dynamic random-access memory (DRAM) utilizing in-line error correction code (ECC).

16. The device of claim 10, wherein the command is received in response to an event comprising one or more of:
 a boot-up of the device;
 a state error detected in the memory; or
 a transient error detected in the memory.

17. The device of claim 10, wherein the clear content command includes an indicator configured to identify the first set of memory cells.

18. The device of claim 10, wherein the first set of memory cells comprise at least one row of memory cells in each memory bank of the plurality of memory banks.

19. An apparatus configured to clear content stored on a memory of an electronic device, the memory comprising a plurality of memory banks on each of which a plurality of memory cells are arranged, each of the plurality of memory cells coupled to an associated sense amplifier, the apparatus comprising:
 means for receiving a clear content command configured to clear content stored on a first set of memory cells of the plurality of memory cells of the plurality of memory banks; and
 in response to the clear content command, means for activating a first switch and a second switch of each sense amplifier associated with each of the first set of memory cells, the first switch coupled between a first bit line of a corresponding memory cell and a ground, the second switch coupled between a second bit line of the corresponding memory cell and the ground, wherein activating the first switch and the second switch is configured to clear the corresponding memory cell by grounding the first bit line and the second bit line.

20. The apparatus of claim 19, wherein the clear content command comprises a first phase command and a second phase command, the first phase command comprising a first sequence of bits, and the second phase command having a second sequence of bits complementary to the first sequence of bits.

21. The apparatus of claim 20, wherein the means for receiving the clear content command comprises a means for receiving the first phase command prior to the second phase command.

22. The apparatus of claim 19, wherein the means for receiving the clear content command comprises a means for reading a multi-bit command stored in a mode register.

23. The apparatus of claim 22, further comprising means for clearing the mode register in response to a determination that the content of the first set of memory cells has been cleared.

24. The apparatus of claim 19, wherein the memory is a dynamic random-access memory (DRAM) utilizing in-line error correction code (ECC).

25. The apparatus of claim 19, wherein the command is received in response to an event comprising one or more of:
 a boot-up of the apparatus;
 a state error detected in the memory; or
 a transient error detected in the memory.

26. The apparatus of claim 19, wherein the clear content command includes an indicator configured to identify the first set of memory cells.

27. The apparatus of claim 19, wherein the first set of memory cells comprise at least one row of memory cells in each memory bank of the plurality of memory banks.

28. A non-transitory computer-readable storage medium that stores instructions that when executed by a processor of an apparatus cause the apparatus to perform a method of clearing content stored on a memory of an electronic device, the memory comprising a plurality of memory banks on each of which a plurality of memory cells are arranged, each of the plurality of memory cells coupled to an associated sense amplifier, the method comprising:

receiving, by the apparatus, a clear content command configured to clear content stored on a first set of memory cells of the plurality of memory cells of the plurality of memory banks; and in response to the clear content command, activating, by the apparatus, a first switch and a second switch of each sense amplifier associated with each of the first set of memory cells, the first switch coupled between a first bit line of a corresponding memory cell and a ground, the second switch coupled between a second bit line of the corresponding memory cell and the ground, wherein activating the first switch and the second switch is configured to clear the corresponding memory cell by grounding the first bit line and the second bit line.

29. The non-transitory computer-readable storage medium of claim 28, wherein the clear content command comprises a first phase command and a second phase command, the first phase command comprising a first sequence of bits, and the second phase command having a second sequence of bits complementary to the first sequence of bits.

30. The non-transitory computer-readable storage medium of claim 29, wherein receiving the clear content command comprises receiving the first phase command prior to receiving the second phase command.

\* \* \* \* \*